United States Patent [19]

Jacob et al.

[11] 4,268,842
[45] May 19, 1981

[54] ELECTROLUMINESCENT GALLIUM NITRIDE SEMICONDUCTOR DEVICE

[75] Inventors: Guy M. Jacob, Pontault; Michel Boulou, Brunoy, both of France

[73] Assignee: U.S. Philips Corporation, New York, N.Y.

[21] Appl. No.: 12,790

[22] Filed: Feb. 16, 1979

Related U.S. Application Data

[63] Continuation of Ser. No. 829,893, Sep. 1, 1977, abandoned.

[51] Int. Cl.³ .............................................. H01L 33/00
[52] U.S. Cl. ......................................... 357/17; 357/61
[58] Field of Search ............................. 357/17, 30, 61

[56] References Cited

U.S. PATENT DOCUMENTS

| | | | |
|---|---|---|---|
| 3,683,240 | 8/1972 | Pankove | 357/17 |
| 3,783,353 | 1/1974 | Pankove | 317/235 R |
| 3,849,707 | 11/1974 | Broslau | 317/234 R |
| 3,865,655 | 2/1975 | Pankove | 148/189 |
| 3,922,703 | 11/1975 | Pankove | 357/17 |

Primary Examiner—Martin H. Edlow
Attorney, Agent, or Firm—Thomas A. Briody; Robert T. Mayer; Steven R. Biren

[57] ABSTRACT

An electroluminescent semiconductor device includes a monocrystalline substrate, an n-type gallium nitride layer on the substrate, an active gallium nitride layer on the n-type layer which is doped to at least full compensation of the natural donor impurities with acceptor impurities, a surface electrode for contacting the active layer and means for contacting the n-type layer. A part of the n-type layer, which extends parallel to the active layer and adjoins the active layer, is doped to less than full compensation by means of the acceptor impurities, and the net concentration of donor impurities is smaller than the concentration of natural impurities and is substantially homogeneous in the layer portion. Electroluminescent semiconductor devices in accordance with the invention feature improved efficiency as well as better reproducibility than prior art devices.

11 Claims, 5 Drawing Figures

ELECTROLUMINESCENT GALLIUM NITRIDE SEMICONDUCTOR DEVICE

This is a continuation of application Ser. No. 829,893, filed Sept. 1, 1977, now abandoned.

BACKGROUND OF THE INVENTION

The present invention relates to an electroluminescent semiconductor device of the type which, starting from a monocrystalline substrate, is provided successively with: an n-type gallium nitride layer, an active gallium nitride layer doped at least to complete compensation of the natural donor impurities with acceptor impurities and a surface electrode which is in contact with the said active layer, the said device comprising in addition means to contact the said n-type layer.

The invention also relates to a method of manufacturing such a device.

It is known that electroluminescent semiconductor devices are used especially to display data in various forms and are provided with punctiform, digital or alphanumerical indicators in accordance with whether they have a punctiform luminescent region, a luminescent region having segments or a dot matrix. Various types of devices have been proposed as far as mode of operation is concerned.

Up to now, devices having pn-junctions have been preferred due to their good luminous efficiency, their rigidity, their life and their comparatively low polarization voltage compared with other optical display devices using different techniques.

The semiconductor materials most frequently used to apply such devices are gallium arsenide, gallium arsenide phosphide, aluminium gallium arsenide and gallium phosphide, which permits a light emission in radiation ranges which are between the near infra-red and the green, such as red, orange and yellow. It is known that the forbidden bandwidth of a semiconductor inter alia determines the maximum radiation energy which it can emit. On the other hand, in accordance with the nature and the concentration of certan impurities incorporated in the semiconductor, the energy of the radiation which it can emit may be reduced and thus radiations may be obtained the color of which approaches that of infra-red.

It thus has been endeavored to expand the range of semiconductor materials used so far in such manner that the spectrum of visible radiation is fully covered and to produce light in the blue, the violet and even in the near ultra-violet.

Recently, gallium nitride has been suggested as one of the semiconductor materials which are suitable for this purpose.

At the moment it is not possible to obtain monocrystalline gallium nitride other than by an epitaxial method by which the synthesis of the material is simultaneously performed at a temperature which is much lower than the melting point of said material. In fact it is known that gallium nitride has a clear tendency to decomposition into its element when it is heated at a high temperature, for example above 800° C.

Associated with this tendency to dissociation is the fact that during the synthesis of GaN in the vapor phase, by reaction of gallium monochloride with ammonia gas, the whole immersed in a carrier gas, the material obtained without intentional doping (the materials used in the reaction being as pure as possible) is always of the n-type and wth a high concentration of donors originating from centers which to all probability are related to "nitrogen vacancies". The donor centers will hereinafter be referred to as natural donor impurities.

It is known, especially by a publication of J. I. Pankove, entitled "Luminescence in GaN" published in "Journal of Luminescence", volume 7, 1973, pp. 114, 126, that by the introduction of a dopant, such as zinc, cadmium, magnesium, lithium or beryllium, the natural conductivity of the n-type of the material can be compensated. It is possible to obtain substantially insulating gallium nitride by using a sufficiently high concentration of the said dopant. Until now it has not been possible to obtain gallium nitride in this manner having a large p-type conductivity. As a result of this, the electroluminescent GaN devices of the known type mainly have an M-i-n structure, that is to say: metal/GaN of substantially insulating type/GaN of the n-type.

A close investigation of the prior art as described especially in the above-mentioned publication "Journal of Luminescence" reveals that the results obtained with the electroluminescent gallium nitride devices with M-i-n structures, taken on an average, remains comparatively moderate with respect to luminous efficiency. In particular, the operating characteristics of the devices usually are very different for each individual device and for each individual material sample. The lack of reproducibility relates especially to the polarization voltages of the devices at a given current density and the homogeneous character of the luminescence of the active zone, said characteristics being without apparent correlation to the thicknesses of the layers used. The color of the radiation itself does not seem to be apparently related to the growth conditions of the semiconductor material.

In another paper by J. I. Pankove entitled "Low Voltage Blue Electroluminescent in GaN" published in "IEEE Transactions on Electron Devices", volume ED 22, No. 9, Sept. 1975, p. 721, the author remarks that for reasons which are still obscure the incorporation of zinc in the crystal seems to increase gradually during the growth, although the partial pressure of zinc in the atmosphere of the reaction was apparently maintained constant. The complete compensation of the zinc-doped layer thus occurs only towards the center of the thickness thereof, which will cause uncertainty regarding the thickness of the layer parts of the n-type on the one hand and of the substantially insulating type on the other hand, the concentration variation of the impurity as a function of the thickness of the growing material occurring in a nearly uncontrollable manner, especially at the precise depth level where the layer becomes insulating.

As regards the range of the wavelengths which the electroluminescent GaN devices can emit, it is known that this can vary with the nature and the concentration of the dopant incorporated in the material so as to make the active layer substantially insulating. For example, in the case in which the said dopant is zinc, a luminescence has been observed in some cases the intensity of which culminates in the proximity of a wavelength of 440 nm, for example, a blue light with an energy of approximately 2.8 eV, or, in the proximity of 500 nm, green light, with an energy of 2.5 eV, or, in the proximity of 565 nm, yellow light with an energy of 2.2 eV.

Although it has been observed here and in general that the color obtained depended on the concentration in such manner that a comparatively weak concentration corresponds to an emission of blue color and a comparatively strong concentration corresponds to an emission of yellow color, this has so far not been confirmed by experiments. The lack of reproducibility of the experiments stated in the prior art does not permit drawing a conclusion as regards the experimental conditions in which one of the luminescent wavelengths can be obtained in a regular manner.

SUMMARY OF THE INVENTION

A special object of the invention is to mitigate the above-mentioned drawbacks by suggesting structural changes for the device which can improve the operational characteristics considerably. The invention also provides a new method of obtaining an electroluminescent device wth an emission in a given wavelength range, which method uses the epitaxial growth from a gaseous phase of a gallium nitride body on a suitable monocrystalline substrate obtained by reaction in a carrier gas of a gallium halide with ammonia.

During experiments relating to the properties of the epitaxial gallium nitride layers, it was found desirable to reduce the causes of the fluctuation of the characteristics of the deposited layers as much as possible. To all probability, Applicants have obtained layers with the p-conductivity type, especially by doping with zinc, in which the mobility of the charge carriers still remains very small. Said layers, which seem to conduct the electrical current due to a special conductivity mechanism which lies nearer to that of a dielectric than that of a semiconductor, all show a comparatively high resistivity in the experiments performed so far. For this reason and for simplicity, an "active" layer is to be understood to mean hereinafter both a semiconductor material of the p-type of high resistivity, for example $10^2$ ohm cm to $10^6$ ohm cm, and a more accurately compensated material, so clearly insulating, whose resistivity is higher than $10^6$ ohm/cm.

The invention is based in particular on Applicants' discovery of the attractiveness of the application in the device of a zone which adjoins the active film whose net concentration of donor impurities is small with respect to the concentration of natural donor impurities, and, on the other hand, on the discovery of a method to cause the said net concentration in the material to vary during the epitaxial growth, with which the treatment period is considerably reduced.

According to the invention, the electroluminescent semiconductor device of the type which, starting from a monocrystalline substrate, is provided successively with: an n-type gallium nitride layer, an active gallium nitride layer doped at least to complete compensation of the natural donor impurities with acceptor impurities, and a surface electrode which is in contact with the said active layer, the said device comprising in addition means to contact the said n-type layer, is characterized in that at least a part of the said n-type layer which extends parallel to the said active layer and adjoins the same, is doped to less than the full compensation by means of the said acceptor impurities, that the new concentration of donor impurities is smaller than the concentration of the said natural impurities, and that said net concentration of donor impurities is substantially homogeneous in the said layer part.

The new device according to the invention has the advantage that it is suitable for a better controlled construction and thus is more accurate, while it is nevertheless easier to make. The use of an n-type layer part with small resulting net concentration which shows a substantially constant level might appear to indicate that the resistance of the device is increased and that the device according to the invention thus operates with an increased polarization voltage. In reality, this effect in itself is very small and proves to be amply compensated by the strong improvement resulting from the new construction. The impurity concentration profile in the area of the interface between the n-type layer and the active layer actually is more easy to control according to the invention and it is favorable in particular to realize said concentration profile with a large steepness in the said interface area, which has a very important repercussion on the current-voltage characteristic of the device according to Applicants' observations.

It is favorable when in the said n-type layer part of the device according to the invention the value of the said net concentration of the said impurities is between one tenth and one millionth part of the value of the concentration of the said natural impurities.

According to this preferred embodiment of the invention the concentration of the acceptors impurities in the said layer part, although lower than that which occurs in the said active layer, is nevertheless high because it is at least equal to 10% of the concentration of natural donor impurities of the undoped material. Applicants have established that the incorporation of the dopant at this concentration level favorably influences the morphology of the layer and that the layer tends gradually to become planar during growth. This effect is particularly favorable because the active layer which adjoins the said layer part thus also shows a planar and parallel morphology which improves both the special distribution of the light emitted below the surface electrode and the reproducibility of the electrical and luminescent characteristics of the device.

The above effect is noticeable only with a minimum thickness of the deposited material with dopant so that it is favorable when the thickness of the layer part of low net resulting concentration and adjoining the said active layer is larger than 4 microns and preferably is between 10 and 25 microns.

In a preferred embodiment of the device according to the invention the active layer has a thickness between 5 and 200 nm and in particular between 50 and 150 nm, which presents the advantage that the value of the polarization voltage necessary for a satisfactory operation of the device is minimized.

It is favorable when the monocrystalline substrate used is pervious to the radiation emitted by the device and in this category, corundum is to be preferred in particular.

The advantages of the device according to the invention and especially according to the particular and preferred embodiments described above which will be described in detail hereinafter, can still be emphasized because with the said device a polarization voltage of 3 to 8 Volts has been obtained in a reproducible manner as against 40 to 100 Volts with the known method (in which an exceptional value is noted, it is true, obtained at 3–6 Volts) and in addition, with the device according to the invention, external quantum outputs which are typically between $10^{-3}$ and $10^{-2}$ as against values of $10^{-5}$ to $10^{-3}$ with the known devices.

The invention also relates to a method of obtaining an electroluminescent semiconductor device, which method comprises in particular the epitaxial growth on a suitable monocrystalline substrate from a gaseous phase of a gallium nitride body obtained by reaction in a carrier gas of a gallium halide with ammonia, which gallium nitride body has a junction between an n-type layer and an active layer doped to at least full compensation of the natural donor impurities by the addition to the said gaseous phase of a flux with a p-type dopant, characterized in that at least during the step of the growth of the said n-layer preceding the growth of the said active layer an extra quantity of a hydrogen halide, as well as the said flux with the said dopant, are incorporated in the said gaseous phase, the said flux being adjusted at a value which lies in the proximity of but is lower than that which causes the full compensation of the said natural donor impurities in similar growth conditions and that, when the growth during the said step has been stabilized, the growth of the said active layer is proceeded by a variation of the supply of the reactive gases, which results in an increase of the ratio of the partial pressures between the gallium halide and the hydrogen halide, the said flux with the said dopant being maintained substantially constant.

The advantage of this method is that in the deposited gallium nitride body a junction is formed between the n-type layer and the active layer which reproduces in a minimum time interval the interference on the gaseous phase, which time interval is reduced as the speed of the gases in the reactor is higher. The doping profile can be realized with a controllable angle of inclination in the transition region, in particular with a very large angle of inclination, which results in a reduction of the polarization voltage which is necessary to ensure that a current of a few milliamperes traverses through the device in the forward direction. Because the doping profile is better controlled, the method for the epitaxial deposition provides materials with better reproducibility characteristics in identical conditions. The efficiency of manufacture of the devices proves to be considerably improved by it. The manufacture of devices according to the preferred embodiment of the invention with an active layer of a very small thickness also proves to be considerably facilitated. The method according to the invention permits in particular the deposition of layers whose thickness is between 5 and 200 nm.

In a preferred embodiment of this method the variations of the proportion of the reactive gases consists in particular of a reduction of the extra addition of the said hydrogen halides and said variation consists preferably of a suppression of the said extra addition.

A particular application of the method according to the invention is characterized notably in that the said variation of at least one of the said additions is adjusted to influence the activity of the dopant in the said active layer for an emission at a given wavelength.

As regards the expression "activity of the dopant" it is to be noted that it is to be understood to mean not only the fact that during the growth the actual concentration of dopant in the material can vary solely under the influence of the indicated changes of the partial hydrogen halide pressure and/or the partial gallium halide pressure, but in addition that the actual concentration of dopant can remain substantially constant during the growth and that the indicated changes of the conditions only vary the electronic activity in the material. Recent analyses seem to justify said latter hypothesis. From experiments performed by Applicants, however, it has been shown very clearly that the electrical and optical effects of the dopant are varied as if the concentration of the said dopant had been varied, for which reason within the scope of the method according to the invention the expression "effective incorporation" of the dopant is also used to indicate that according to one hypothesis or the other, the phenomenon according to the observed effects is designated.

According to another particular embodiment of the method according to the invention it is favorable for obtaining a comparatively large wavelength of the radiation emitted by the device to intensify the activity of the dopant in the active layer by varying the addition of the reactive gases in such manner that a strong disequilibrium results from it for the deposition reaction during the growth of the said active layer, which embodiment can be favorably combined with the intensification of the activity of the said dopant succeeding a substantially instantaneous execution of the said variation of the addition. Further details relating to this embodiment, shown in FIG. 5, are provided below.

In order to obrain a comparatively small wavelength emitted by the device it is favorable to restrict the activity of the dopant in the active layer by varying the addition in such manner that a moderate disequilibrium of the deposition reaction during the growth of the said active layer occurs, which embodiment may be combined with a restriction of the activity of the said dopant succeeding a gradual performance of the said variation of the addition.

By proceeding according to the above embodiments of the invention one benefits in particular by the advantage of knowing the direction in which the regulations have to be carried out which result in a given emission wavelength of the device. The method according to the invention presents the advantage in the special embodiments thereof that it permits a choice of growth conditions which are best suitable for obtaining a good crystal quality of the resulting material and for a good flat state of the surface, and in these conditions in particular the partial pressure of the incorporated dopant, while obtaining a desired emission wavelength can be facilitated in a comparatively independent manner by the indicated modification of the effective incorporation of the dopant in the active layer. The method according to the invention has the additional advantage of providing the means to obtain a given emission wavelength of the gallium nitride device with a singl basic method including the use of a single partial pressure of the dopant by only varying the growth conditions of the active layer, in the last instants of the growth. By the large number of combinations of conditions which procure a given range of wavelengths it is easy with the method according to the invention to choose among these conditions that one which offers the greatest reproducibility of the results.

In another special embodiment of the method according to the invention the variation of the addition of the reactive gases coincides substantially with the variation of the partial pressure of the said gallium halide introduced into the said gaseous phase. Since the said partial pressure of the gallium halide exerts a decisive influence on the growth rate of the material, one benefits by the advantage of the separated choice for the growth conditions on the one hand of the n-type layer and on the other hand of the active layer by performing the variation of the said partial pressure at the instant at which the said active layer begins to grow. In fact, a value for the partial pressure of the gallium halide may be chosen which leads to a reasonable growth duration of the said n-type layer and which simultaneously is most favorable to obtain a good surface state of the epitaxial material of the said layer. Also according to this embodiment of the invention another value for the said partial pressure of the gallium halide may be chosen independently during the growth of the said active layer, which value is best suitable for the emission in a given wavelength range, whle facilitating the reproducibility of the characteristics of the said active layer.

In the method according to the invention the said variation of the addition of reactive gases preferably consists mainly of a reduction of the extra addition of the said hydrogen halide in the gaseous phase.

The said gallium halide advantageously is gallium monochloride, the said hydrogen halide is hydrogen chloride and the said dopant is zinc.

BRIEF DESCRIPTION OF THE DRAWING

The invention will now be described in greater detail with reference to the accompanying drawings, in which.

DETAILED DESCRIPTION

Figure 1:
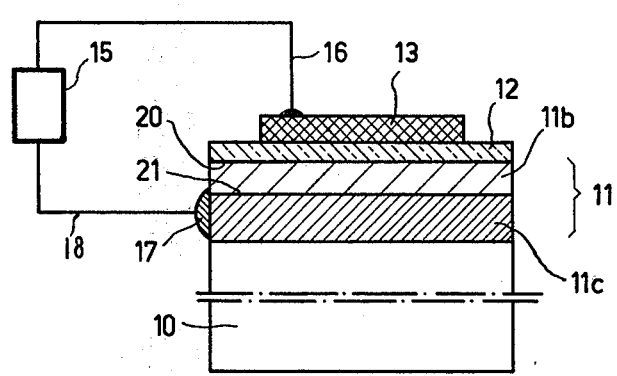
FIG. 1 is a diagrammatic sectional view of a device according to the invention.

The device shown in FIG. 1 comprises a monocrystalline transparent substrate 10, an n-type gallium nitride layer 11 on which an active layer 12 of gallium nitride is provided doped at least to full compensation of the natural donor impurities with acceptors in the gallium nitride, and a surface electrode 13 which is in contact with the layer 12. A direct current generator 15 placed outside the device has one of its terminals connected to the surfcace electrode 13 via the connection 16, while the other terminal is connected to the layer 11 by the contact connection 17 and the connection 18.

According to the invention, the device compries a layer portion 11b of the layer 11 which adjoins the layer 12 and which extends parallel to said layer, said layer portion being doped to less than the compensation by means of the said dopant so that the net concentration of resulting impurities is small. The layer portion 11c of the layer 11 which adjoins the substrate 10 on the contrary comprises such a high concentration of donors that it can be obtained by the epitaxial deposition of the gallium nitride without the introduction of the dopant. The contact connection 17 preferably adjoins at least the layer portion 11e of the layer 11 which has a low resistivity and permits a uniform distribution of the current in the active zone of the device extending below the surface electrode 13.

The current characteristic as a function of the voltage across the device shown in FIG. 1 is qualitatively analogous to that of a diode, that is to say that a forward direction is established when the connection 16 is connected to the positive terminal of the generator and the connection 18 is connected to the negative terminal. With the device according to the invention luminescence is obtained by polarization in the forward direction. This device has the advantage that it can be constructed with greater accuracy as the thickness of the active layer 12 and the net concentrations profile at the point of transition 20 between the layer 11 and the active layer 12 can be controlled more easily at the instant of constructing the device. The compensation of the donor type in the active layer 12 requires the incorporation of an important concentration of the dopant forming the acceptors. The use of such an impurity concentration during the growth of a gallium nitride layer by known methods is neither rapid nor precise.

In the device according to the invention, the imperfections resulting from the gradual concentration profile are displaced to a transition zone 21 between the two layer portions 11b and 11c of the layer 11, which are both of the n-type, while the extra doping which is necessary to form the active layer 12 from the point of transiton 20 then represents only a small part of the concentration of the dopant already used at which part the introduction of the material can easily be controlled in a small period of time.

Figure 2:
FIG. 2 shows a diagram representing the net concentration profile of donor impurities in the semiconductor material of the device shown in FIG. 1 viewed in the direction of the thickness of the material.

FIG. 2 is a diagram showing the net concentration profile of donor impurities according to the thickness of the semiconductor material of the device shown in FIG. 1, in which the concentration N is shown on the vertical axis and the thickness Z on the horizontal axis.

From the abscissa point I representing the interface between the substrate and the gallium nitride layer, the concentration of donor impurities is very high, corresponding to the value $N_2$ of the diagram. From the abscissa point Z21 which likes near the zone of transition 21 of FIG. 1, the net concentration of impurities has dropped by compensation to the value $N_1$ which is very noticeably lower and is substantially constant in the thickness of the layer portion 11b of the layer 11, FIG. 1, that is to say, to the abscissa point Z20 of the diagram corresponding to the point of transition between the layer 11 and the active layer 12 of the device shown in FIG. 1. In the active layer 12 the net concentration of noncompensated donor impurities is extremely small and may even be considered to be equal to zero with respect to the preceding concentrations $N_1$ and $N_2$, thus between the abscissa points Z20 and S of FIG. 2, S representing the top of the semiconductor body adjoining the surface electrode.

It will be obvious from FIG. 2, in which, however, for clarity the proportion of the represented values have not been observed, that the transition near the abscissa point Z20 is more easy to control in a restricted thickness of the material than the transition near the abscissa point Z21; it is establisheed that it is the transition near the abscissa point Z20 which has the most important repercussions on the operating characteristics of the device.

During experiments with the device according to the invention, which device was used in several embodiments and proportions, Applicants have always observed that the characteristic curve of current as a function of the polarization voltage applied in the forward direction can mainly be represented by a linear relationship between the logarithm of the current value and the square root of the value of the applied potential. This characteristic of the operation of the device according to the invention distinguishes clearly from that of the previously known electroluminsescent gallium nitride devices and permits obtaining a reduction of the polarization voltage which is necessary for normal operation of the device. Generally this corresponds to the use of a current of a few milliamperes for a punctiform visual indicator. A reduction of the polarization voltage to only a few volts can be obtained by optimizing the layers in the construction of the device according to the invention and in particular by reducing the thickness of the transition between the n-type layer and the active layer and the thickness of the active layer itself.

Figure 3:
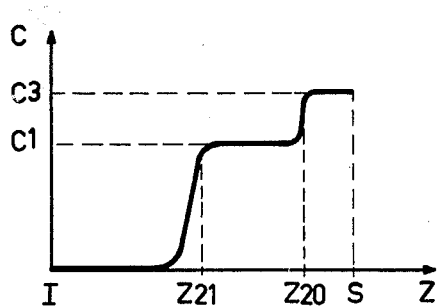
FIG. 3 is a diagram showing the concentration profile of the acceptors introduced into the material during the epitaxial growth.

FIG. 3 is a diagram representing the concentration profile of the acceptors related to the dopant introduced into the semiconductor.

The concentration C is plotted on the vertical axis while the scale of the horizontal axis has the same references as those of FIG. 2 and also represents the thickness of the semiconductor body according to the variable Z. The exact nature of the acceptors which are formed by the impurity is not precisely known so that the diagram of FIG. 3 representing the concentration of said states need not be confused with the diagram indicating the concentration of doping impurity atoms. However, the concentration profile of doping atoms is of substantially the same nature.

The epitaxial layer portion of gallium nitride adjoining the substrate is deposited without the introduction of the dopant or with the introduction in a negligible quantity so that the concentration of acceptors may be considered to be equal to zero from the abscissa I. The concentration of donors due to the natural impurity then is maximum, as is visible in FIG. 2, in the same layer portion.

The concentration of acceptors becomes important in the layer portion adjoining the active layer and this forms a transition zone of which the abscissa point $Z_{21}$ marks the beginning beyond which the concentration the value of which is represented by $C_1$ becomes comparatively constant. At the point of transition between the n-type layer and the active layer, which point is denoted by the abscissa $Z_{20}$, the concentration of acceptors changes abruptly from level $C_1$ to the high level $C_3$, which level is at least equal to the concentration of original donors of the material so that substantially no free electrons exist in the active layer, for example, between the active points $Z_{20}$ and S of the diagram. Preferably the same doping body is used to form the concentration of acceptors $C_1$ and the concentration of states $C_3$, the concentration $C_1$ being slightly smaller than the concentration of natural donor impurities of the material so that the material of the n-type remains between the abscissa points $Z_{21}$ and $Z_{20}$. The concentration of acceptors $C_1$ is chosen to be sufficiently large and so near to the concentration of natural donor impurities of the material that the net resulting concentration $N_1$ (FIG. 2) is preferably between one tenth and one millionth part of the concentration $N_2$.

A typical embodiment of the device according to the invention will now be described by way of non-limiting examples.

The substrate 10 consists of a 350μ thick corundum disc. The substrate is covered with a gallium nitride body which is deposited by vapor phase epitaxy, use being made of the reaction between galliun monochloride and ammonia. The said gallium nitride body consists of a first n-type layer portion adjoining the substrate, thickness 10 to 20 microns, resistivity in the order of $2.10^{-3}$ ohm.cm corresponding to a concentration of free electrons of 2 to $5.10^{19}$/cm$^3$, a second n-layer portion, thickness approximately 15μ which is doped with zinc in such manner that the resistivity thereof is brought to a few ohm.cm by partial compensation, and finally an active layer of gallium nitride which is doped with zinc at least to the compensation, for example to a concentration exceeding a few times $10^{19}$/cm$^3$, of high resistivity and a thickness in the order of 100 nanometers.

Such a device is completed by a surface electrode which consists of a disc of gold provided by vapor deposition on the surface of the active layer, diameter 0.6 mm, and of a contact with the disc of the n-type layer which is realized, for example, by means of an indium disc which is soldered in a groove provided in the said layer.

Applicants have observed a favorable and unexpected effect with respect to the structure of the device according to the invention; during the deposition of the n-type layer portion adjoining the active layer, a very significant improvement of the surface state occurs, the effect of which gradually makes itself felt from the instant at which the dopant is introduced into the material of the layer in a considerable concentration.

Althogh noticeable improvement of the morphology of the layer occurs at minimum thickness, it is favorable when the thickness of the partly compensated layer portion adjoining the active layer exceeds 4 microns and preferably is between 10 and 25 microns, which range of thicknesses forms a good practical compromise.

The structure of the device according to the invention and especially in connection with the manufacturing method which will be described hereinafter and which also forms part of the invention, is suitable for the manufacture of electroluminescent gallium nitride devices in which the thickness of the active layer is very small, especially as compared with earlier known constructions. While providing the advantage of a reduction of the polarization voltage, the device according to the invention comprises an active layer whose thickness is between 5 and 200 nm and preferably is between 50 and 150 nm.

Although the device according to the invention has been described with reference to a concrete embodiment, it will be obvious that variations which can easily be conceived by those skilled in the art are possible and that said variatios fall within the scope of the present invention. Notably, for example, the use of other materials for the substrate which are preferably transparent for the emitted radiation or of an impurity other than zinc and, for example, cadmium, beryllium, magnesium, lithium, may be considered. When using an opaque substrate it is favorable when a conductive substrate is chosen to ensure the electrical contact with the n-type gallium nitride layer and in that case the surface electrode will be made transparent so as to enable the emission of the radiation through the front face.

Finally, because the invention relates in particular to the n-type layer portion which is partly compensated and the means to realize the transition between said layer and the active layer, it will be obvious, that, although more especially devices having an n-type layer have been described which are composed of two parts for which the natural donor impurities for one are not compensated and for the other are partly compensated, the invention is not restricted, thereto. On the contrary, it extends to the case in which the first noncompensated n-type layer portion is omitted and further to any device of the type mentioned having, from the substrate, an arbitrary number of n-layers and the lowest part of which is in accordance with the characteristic feature described.

A favorable method of manufacturing the device according to the invention will now be described with reference to FIG. 4 which shows diagrammatically the apparatus for the epitaxial deposition from the vapor phase of gallium nitride used by Applicants.

One or several substrates 31 of corundum having a thickness of 350 μm and an orientation (0001) are placed on a movable support 32 in a reactor 30 of the horizontaltype. The reactor 30 is placed in a resistance furnace of which an upstream pre-heating winding 35 is used to evaporate the dopant 36 which is provided in the sphere 37b of a movable tube section 37. The winding 38 of the furnace serves on the one hand to heat the gallium source 40 in the sphere 41b of the movable tube section 41 and on the other hand to heat the substrate 31. Mainly, three different temperature zones are realized. The zone 43 to evaporate the dopant of which the temperature for the use of zinc is in particular between 450° and 800° C., the zone 44 in which the gallium monochloride (GaCl) is produced starting from the gallium source 40 and a flow of hydrochloric acid gas at a temperature which is preferably higher than 800° C. in order that the said GaCl production is complete, and the zone 45 which is the zone for the reaction and the deposition of gallium nitride on the substrate 31 the temperature of which is preferably controlled between 900° and 1000° C. An accurate value of the temperature of the zone 43 can be maintained by means of the thermocouple 50 and also for the temperature of the zone 45 due to the thermocouple 51. The reactor 30 comprises four gas inlet ducts. The main inlet 60 permits the introduction of the carrier gas which preferably is nitrogen (or argon) the supply of which is ensured by the control members which are denoted by 61, to which carrier gas an extra quantity of hydrogen chloride is added which is supplied and controlled by the members at 62. The inlet 63 is reserved for the introduction of ammonia gas (NH$_3$) which is supplied by the members 64, the inlet 65 is used for the introduction of reactive hydrogen chloride which is supplied at 66 and during the passage of the gallium source 40 produces the GaCl which is necessary for the synthesis reaction, which GaCl is introduced into the reactive gas phase a few centimeters upstream of the substrate 31, and finally the inlet 68 which introduces a fluxx in the movable tube section 37 to take along the vapour of the dupont 36, which flux is, for example, nitrogen supplied at 69.

A first n-type gallium nitride layer portion is deposited in the following conditions: the deposition temperature is near 950° C., the overall pressure of the gases in the reactor which has a diameter of 40mm is near atmospheric pressure, with a total supply in the order of 10 liters per minute. The partial ammonia pressure is 15%; the partial pressure which corresponds to the extra addition of HCl at 62 is $5.10^{-2}$: the partial pressure which corresponds to the supply of reactive HCl at 66 is $3.10^{-3}$ which, as is known, is approximately substantially equal to that of the produced GaCl; a supplly of nitrogen equal to one twentieth of the overall supply of the gases occurs at 69 but during this first stage of the growth the zone 45 of the furnace is not fed so that the dopoant 36 remains at a temperature which is lower than 150° C., which for the case of zinc in our example corresponds to a negligible supply of atoms in this growing gallium nitride body. This first part of the epitaxial deposition can preferably be started in various conditions which are favorable for a good nucleation, according to the description in French Patent Application filed by Applicants under No. 7,508,612 under the title "Process for obtaining by heteroepitaxy from the vapour phase monocrystals of gallium nitride", and which corresponds to U.S. Ser. No. 667,690, filed Mar. 17, 1976, in particular, for example, by reducing during the first 30 minutes of the growth the supply of reactive HCl at 66, of which the partial pressure is reduced to $1.10^{-3}$ and by increasing, during the same period, the partial pressure of HCl of the extra addition at 62 to $1.10^{-1}$, so that the ratio of the partial pressure: $_{pp}$GaCl/$_{pp}$HCl in the reaction zone then is approximately 1/100.

According to the invention, during a second growth stage a second part of the n-type gallium nitride is deposited under conditions which are not changed with respect to the preceding conditions except that during this stage the zone 43 of the furnace is heated to 700° C. as rapidly as possible so that zinc is provided in the layer in a concentration which lies near to but is lower than that which provides the full compensation of natural donor impurities. This second layer portion thus is of the n-type but in a concentration of free electrons which is preferably reduced by a factor of 10 to $10^6$ with respect to the natural concentration of electrons which occurs in the first part of the layer and the value of which usually is between 1 and $5.10^{19}$/cm$^3$.

The temperature of 700° C. of the zone 43 used by Applicants corresponding to a value which is determined previously experimentally and which has to be determined accurately in each indiviudal performance of the method. It is favorable when the growth of said second n-type layer portion is continued until the incorporation of zinc in the growing material is stabilized and preferably at a thickness of said portion exceeding 4 microns so as to profit maximally by the improvement of the already stated surface state with respect to the incorporation of the dopant. The second partly compensated layer portion preferably has a thickness between 10 and 25μ.

According to the invention there then occurs to the growth of the active layer of gallium nitride doped with zinc at least to compensation and for this purpose is varied either the partial pressure corresponding to the extra addition of HCl at 62 by reducing it (or by removing it), or by increasing the partial pressure of GaCl which is formed by the addition of reactive HCl at 66, or both simultaneously, which in all cases results in an increase of the incorporation of zinc in the growing material, the partial pressure of zinc in the reactive gas phase remaining substantially unvaried because the nitrogen added at 69 and the temperature of 700° C. of the zone 43 are maintained at their previous values.

Applicants have observed that the above alterations of the partial pressures which are all carried out in the direction which increases the ratio of the partial pressures $_{pp}$GaCl/$_{pp}$HCl, while they simultaneously increase the growth rate of the crystal, also increase the degree of incorporation of the compensating impurity in the crystal. This unexpected effect thus provides according to the invention a preferred means for fully compensating a growing layer when this was of the n-type in a preceding stage of the growth and doped to a value lower than full compensation. So this transition can be programmed in time according to any desired variation and preferably according to a rapid variation, the response time being particularly short between the action effected on the partial pressures: $_{pp}$GaCl and/or $_{pp}$HCl and the effect resulting from the increased doping of the material.

For simplicity, the transition is preferably obtained by an essential reduction and usually simply omitting the extra addition of HCl at 62.

The end of the growth of the active layer is determined by discontinuing the supply of reactive HCl at 66 so that simultaneously the production of GaCl is terminated and hence the synthetic reaction of the gallium nitride.

In a preferred embodiment of the method according to the invention said interruption, after a period of a few seconds to a few minutes, follows the beginning of the growth of the active layer so that the thickness of the said layer is preferably restricted to a value between 5 and 200 nm and preferably between 50 and 150 nm.

When the growth of the active layer is terminated, only the supplied carrier gas and the ammonia flow through the reactor for a few minutes, the furnace is then allowed to cool to ambient temperature, in the atmosphere of the carrier gas, after which the substrate provided with the epitaxial gallium nitride body can be removed from the reactor.

The contact connections necessary for the complete manufacture of the device are produced by known methods, for example, vapor-depositing gold electrodes on the surface of the active layer which is carried out via a mask having apertures of 0.6 mm and soldering an indium disc in a groove which is provided in the thickness of the gallium nitride layer beyond the place of the surface electrode.

In accordance with what has been described above there is thus proceeded to the growth of the active layer of gallium nitride doped with zinc to at least complete compensation by a variation of the supply of at least one of the reactive gases, either an increase of the supply of reactive HCl at 66 which consequently results in an increase of the partial pressure of GaCl in the reactive gaseous phase, or, preferably, a reduction of the extra suply of HCl at 62, or a reduction of the said extra supply combined with such a variation of the partial pressure of GaCl that the ratio of the partial pressures GaCl/HCl in the reactive gaseous phase is increased with respect to the preceding growth stage.

According to a particular embodiment of the method according to the invention the said variation of at least one of the said supplies is adjusted so as to influence the activity of the dopant in the active layer with a view to an electroluminescent emission at a given wavelength. It is to be noted that according to Applicants' experiences, other parameters which determines the equilibrium of the deposition reaction can also influence the efficiency of incorporation of the dopant and hence the emission wavelength. Said parameters are: the temperature of the deposition reaction (that of the zone 45 of the furnace), the partial hydrogen pressure in the reaction phase and the partial pressure of the ammonia. The use of a variation of said parameters, however, is not desired to determine the transition between the n-type layer and the active layer during the growth and the simultaneous control of the activity of the dopant in the active layer with a view to an emission at a given wavelength. In fact, said parameters on the one hand have a small influence compared to that of the parameters according to the invention, and on the other hand, they are not so easy in use such as the variation of the deposition temperature, or they form a source of defects of the crystal structure, for example, the voluntary introduction of a given quantity of hydrogen.

According to a characteristic feature of the use of the invention the temperature of the zone 45 should be maintained within certain limits, namely 920° to 1000° C., since above approximately 1000° C. it becomes very difficult to obtain the compensation of GaN by zinc and below 900° to 920° C. the crystal quality of the epitaxial deposit becomes moderate. It is thus favorable to perform the deposition reaction between 920° and 1000° C. and preferably between 950° and 980° C., in which temperature range the best results are obtained.

Figure 5:
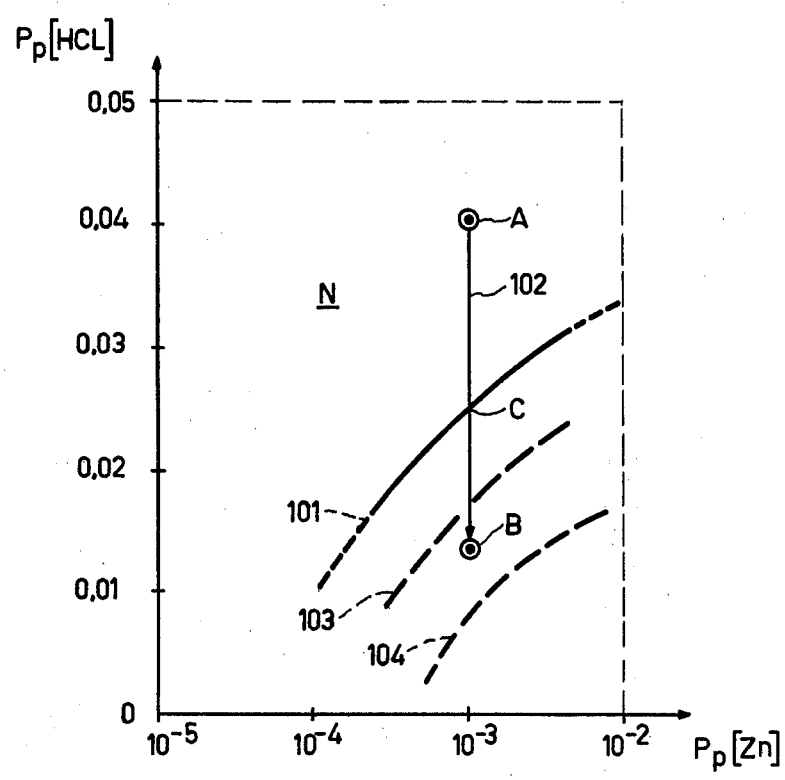
FIG. 5 represents a diagram showing two of the experimental parameters which are of importance for performing the method according to the invention.

FIG. 5 is a diagram showing the deposition reaction conditions according to two parameters: the partial pressure of zinc in logarithmic scale of $10^{-5}$ to $10^{-2}$ of the overall pressure of the gaseous phase on the horizontal axis and the partial pressure of the extra HCl according to a linear scale from 0 to $5.10^{-2}$ of the said overall pressure on the vertical axis.

For a given value of the partial pressure of GaCl, for example in the order of $5-10^{-3}$ and a value of the deposition temperature of 970° C., the experimental conditions can be plotted in the diagram of FIG. 5 in which the epitaxial GaN of the n-type grows, that is to say that it is not fully compensated by zinc, and these points can be distinguished from the other conditions in which the material is substantially insulating because it is fully compensated. The line 101 of the diagram respresents an approximation the separating boundary of said conditions, in which those conditions which lead to a material of the n-type are in the upper half of the Figure on the left of the line 101 in the space denoted by the letter N, while the conditions which lead to the compensation occur in the lower part and on the right of the line 101. A variation of the growth conditions according to the arrow 102 joining the points A and B thus realizes the transition between an n-type layer and a compensated active layer when the partial pressure of zinc is maintained at a constant value during said growth phase. Applicants have found that when the electroluminescence is generated in the active layer from the interface with the n-type layer, the emitted wavelength is substantially determined on the one hand by the end conditions of the growth of the active layer which are represented by the point B, and on the other hand by the manner in which the variation of the conditions are obtained, in particular between point C and point B, C being the point of intersection of the arrow 102 with the line 101. The rate of variation of the partial pressure of the extra HCl, the rate at which the displacement of point C and point B is carried out, is in particular one of the factors which determine the emission wavelength of the device.

Applicants have observed that in the diagram of FIG. 5 the growth conditions of the active layer which lie nearest to the compensation boundary, the line 101, provide devices having the shortest wavelength, while the conditions which are farthest remote from the said line 101 and which thus correspond to a very clear compensation of the active layer, provide the longest wavelength. So in the case of zinc, a zone can be determined in the diagram between the lines 101 and 103 which correspond ponds to the conditions which provide an electroluminescence of blue color and a zone below and on the right of the line 104 which corresponds to the conditions which provide an electroluminescence of yellow color. As is indicated accurately hereinafter, an intermediate zone situated between the lines 103 and 104, as the case may be, may provide an electroluminescence of green color. From the explanations given so far with respect to the diagram of FIG. 5 it follows that according to the invention the activity of the dopant in the active layer can be intensified or restricted to obtain an electroluminescence the wavelength by which is comparatively short by varying an extra supply of HCl such that the point B representing the conditions during the growth of the active layer is situated farther away from and closer to, respectively, the line 101. Still according to the invention, the wavelength emitted by the device can be influenced in addition either by intensifying the activity of the dopant in the active layer by varying substantially instantaneously the extra addition of HCl and proceeding from the conditions of A to B, or on the contrary by restricting the activity of the dopant by carrying out the said variation gradually. With otherwise parameters an emission wavelength is reached which is comparatively long in the case of the intensification of the activity and is comparatively short in the case in which the activity of the dopant was restricted due to the gradual transition.

The diagram of FIG. 5 serves to illustrate diagrammatically and for clarity in a simplified manner the means which according to the invention are used to vary the activity of the dopant in the active layer, to obtain an emission having a given wavelength, but so far only the variation of the extra supply of the HCl has been described. In fact, the diagram of FIG. 5 is plotted for a given value of the partial pressure of GaCl in the reaction phase. In another diagram which would be plotted in an analogous manner but for a different value of the partial pressure of GaCl, the separation boundary which corresponds to the line 101 of the Figure would be in a different position which may be considered roughly as a displacement from the preceding position. Thus, Applicants have discovered that with a partial pressure of GaCl which is higher than that considered for FIG. 5, the new boundary line would have been displaced to the n-type region in the direction of the left-hand upper corner of the diagram, whereas for a lower partial pressure of GaCl the new boundary line would have been displaced in the opposite direction, in that of the corner on the right at the bottom of the diagram. The lines 103 and 104 of the diagram which are associated with condition zones in which the activity of the dopant is weak or strong in the fully compensated material have a position which proves to be varied in accordance with that of the new boundary line which corresponds to the line 101. For example, point B as defined in FIG. 5 by its coordinates, may be moved closer to the new boundary line by a reduction of the partial pressure of GaCl and according to the invention the blue color emission is facilitated. On the other hand, the point B may be moved farther away from the new boundary line by making the dopant more active by increasing the partial pressure of GaCl. In that case the electroluminescence of yellow color is facilitated. As regards the intermediate activity conditions of the dopant which produce a greenish electroluminescence, applicants have found that the said conditions do not exist continuously in the whole of the diagram or in other words that the conditions which are favorable for said wavelength are restricted in particular by certain conditions, in particular to particularly weak partial zinc pressures or to weak partial GaCl pressures.

In accordance with the found results, according to a favorable embodiment of the invention the effects of a variation of the partial pressure of GaCl may be combined with those of the variation of the partial pressure of the extra HCl, especially by performing a variation of partial pressure of GaCl substantially simultaneously with the variation of the extra supply of HCl.

According to a particulrly favorable embodiment of the invention the variation of the supply which produces the growth of the active layer mainly consists of a decrease of the extra supply of HCl, while a variation of the partial pressure of GaCl is used substantially simultaneously so as to determine the emission wavelength of the device in combination with the final value of the HCl supply. The advantage of this embodiment of the method is that the growth of the n-type layer becomes possible in conditions which ensure the best crystal quality with an economical growth duration, while the growth conditions of the active layer can be optimized independently for the emission at a given wavelength with the best possible efficiency.

The reduction of the extra supply of HCl can be performed substantially instantaneously, which is favorable in particular to obtain maximum activity of the dopant in the active layer at a particularly small distance from the junction. It is favorable to perform the reduction of the extra supply of HCl gradually and in that case such a variation is preferred that the partial pressure of the extra HCl reduces at a range less than $1.10^{-3}$ per second. In addition, the said partial pressure of the extra HCl may preferably be caused to vary in steps.

As stated above, a reduction of the partial pressure of the extra HCl has substantially the same effect as that of an increase of the partial pressure of GaCl so that what is stated with respect to the variations of the extra supply of HCl can be assumed analogously for variations in the opposite sense of the partial pressure of GaCl, which variation can be carried out in a substantially instantaneous or progressive manner. From what was stated above with respect to the analogous effect of the extra HCl and of the GaCl when their partial pressures vary in opposite direction, it is concluded that in general a variation of the supply of the reactive gases in such manner that a strong equilibrium shift of the deposition reaction is obtained involves an intensification of the activity of the dopant and thus facilitates obtaining a comparatively long emission wavelength, while conversely a variation of the supply which provides a moderate equilibrium shift in the reaction enables the activity of the dopant to be restricted and consequently enables the realization of a comparatively short emission wavelength.

Gallium monochloride is preferably used as a gallium halide and during the growth of the n-type layer and that of the active layer the partial pressure of the said monochloride is between $5.10^{-4}$ and $5.10^{-2}$ of the overall pressure.

Hydrogen chloride is preferably used as a hydrogen halide and during the growth of the n-type layer the partial pressure corresponding to the extra supply of HCl is between $2.10^{-2}$ and $7.10^{-2}$ of the overall pressure. This makes it possible to reduce afterwards said partial pressure to proceed to the growth of the active layer.

The invention will now be described in greater detail with reference to examples.

FIRST EXAPMPLE

Figure 4:
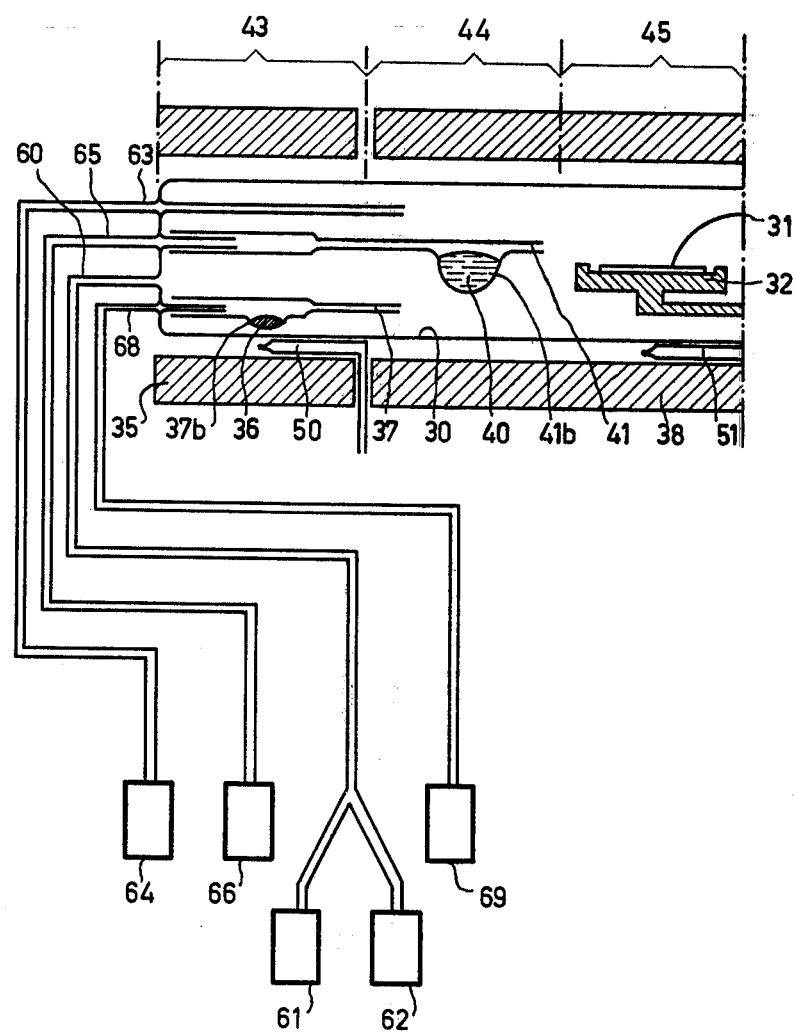
FIG. 4 is a diagrammatic elevation of the apparatus used to perform the epitaxial growth with the introduction of a dopant.

The growth of an epitaxial GaN body is carried out with deposition phases such as those which were described in general with reference to FIG. 4. During the second growth stage of the n-type layer the temperature of the zinc source is adjusted so that in the experimental conditions the partial zinc pressure is $3 \times 10^{-4}$. The partial pressure of GaCl is $2.5 \times 10^{-3}$ during the whole growth process with the exception of the initial nucleation phase of 30 minutes during which period the said pressure is reduced to $1 \times 10^{-3}$. The partial pressure of extra Hcl is first adjusted to $1 \times 10^{-1}$ during the initial nucleation phase, then to $2.5 \times 10^{-2}$ during the growth of the whole n-type layer. The active layer is obtained by discontinuing the extra supply of HCl suddenly and continuing the growth in the new conditions for one minute. The electroluminescent diodes obtained with this material provide a blue luminescence at an operating voltage of 8 to 9 Volts and an external quantum output of a few times $10^{-4}$.

In another experiment carried out in similar conditions but in which the partial pressure of GaCl was only $1 \times 10^{-3}$ during the growth of the active layer, the resulting diode also had a blue luminescence but an operating voltage which was reduced to 3.5 Volts with an external quantum output of $5 \times 10^{-6}$.

A partial zinc pressure between $1 \times 10^{-4}$ and $2 \times 10^{-3}$ is preferably chosen to obtain a mainly blue electroluminescence in the gaseous phase, and while performing the reduction of the extra supply of HCl substantialy instaneously to subsequently maintain the lower partial pressure thereof at $2.5 \times 10^{-2}$, the active layer is grown under conditions which give the reaction a moderate equilibrium shift at a partial GaCl pressure between $1 \times 10^{-3}$ and $4 \times 10^{-3}$.

A partial zinc pressure between $4 \times 10^{-4}$ and $1.5 \times 10^{-3}$ is preferably used.

In the above cases, it is favorable to bring the partial pressure of the extra HCl to a value of zero.

A blue electroluminescence can favorably be obtained by choosing a partial zinc pressure between $5 \times 10^{-4}$ and $1.5 \times 10^{-3}$ of the overall pressure and the growth of the active layer is carried out in conditions which provide a moderate equilibrium shift to the reaction with a partial pressure of GaCl between $3 \times 10^{-3}$ and $6 \times 10^{-3}$, which is a higher range of values, but by not reducing the partial pressure of extra HCl to zero bat, on the contrary, after the substantially instantaneous reduction, maintaining same at a value between $1 \times 5.10^{-2}$.

SECOND EXAMPLE

A gallium nitride body is grown in the following special conditions: from the second growth stage of the n-type layer the partial zinc pressure is adjusted at $9.10^{-4}$. The partial pressure of GaCl is maintained at $3 \times 10^{-3}$ during the whole operation with the exception of the initial nucleation phase. The extra supply of HCl which provides a partial pressure of $3.5 \times 10^{-2}$ during the growth of the n-type layer, is brought to zero in a period of time of 45 seconds, by a gradual reduction which is proportional with time, after which the growth is continued for another minute in the absence of extra HCl. The material obtained after termination of this method provides an electroluminescence of blue color and an operating voltage of 8 Volts and an external quantum output in the order of $10^{-4}$.

In order to obtain a mainly blue electroluminescence in the gaseous phase a partial zinc pressure is preferably chosen which is between $1 \times 10^{-4}$ and $2 \times 10^{-3}$ of the overall pressure and the supply is varied, which results in a reduction of the partial pressure of extra HCl at a rate of variation lower than $1 \times 10^{-3}$ per second to a final value which is lower than $2.5 \times 10^{-2}$, while the partial pressure of GaCl at least from the beginning of the transition phase is between $2 \times 10^{-3}$ and $5 \times 10^{-3}$. In these conditions the partial zinc pressure is preferably between $4 \times 10^{-4}$ and $1.5 \times 10^{-3}$.

In the cases described after the second example it is favorable to bring the partial pressure of extra HCl to a value zero.

Nevertheless, an electroluminescence of blue color can be obtained in addition by choosing a partial zinc pressure between $5 \times 10^{-4}$ and $1.5 \times 10^{-3}$, in which a gradual variation of the supply results in a reduction of the partial pressure of the extra HCl at a rate of variation lower than $1 \times 10^{-3}$ per second to a final value between $1 \times 5.10^{-2}$ and $3 \times 10^{-2}$, while the partial pressure of gallium chloride, at least from the beginning of the transition phase, is between $3 \times 10^{-3}$ and $6 \times 10^{-3}$.

THIRD EXAMPLE

In an experiment which is comparable to that of example 2, however, the following special conditions are established: the particle zinc pressure is brought at $1.2 \times 10^{-3}$, that of GaCl at $5 \times 10^{-3}$ and the extra supply of hydrogen chloride is reduced linearly in time to produce the transition between the n-type layer and the active layer, from an initial value which provides a partial pressure of $3.5 \times 10^{-2}$ to a final volue of zero in a time interval of 105 seconds, after which the growth is continued for 3 minutes without extra HCl. The electroluminescence obtained with this material is of a yellow color at an operating voltage of 20 Volts and the extra low quantum output is in the order of $10^{-3}$.

In an analogous experiment in which the variation of the supply of extra HCl is carried out linearly in 2 minutes and the growth is interrupted as soon as the partial pressure of HCl becomes zero, a yellow luminescence has been obtained in addition but at an operating voltage of only 7 Volts and an external quantum output of $5 \times 10^{-3}$.

A yellow luminescence has also been obtained by carrying out the reduction of the supply of extra HCl in 10 steps of 45 seconds each, which steps uniformly divide the interval of pressures between $3.5 \times 10^{-2}$ and $7 \times 10^{-3}$, which values are the initial value and the final value, respectively, of the transition phase during which the active layer grows. The operating voltage is then higher, in the order of 50 Volts, and the quantimum output is maintained at the high value of $5 \times 10^{-3}$.

In order to obtain a mainly yellow electroluminescence a partial zinc pressure in the gaseous phase is preferably chosen between $6 \times 10^{-4}$, and $5 \times 10^{-3}$ of the overall pressure and while carrying out a reduction of the partial pressure of the extra HCl at a rate of variation lower than $1 \times 10^{-3}$ per second to a final value lower than $3 \times 10^{-2}$, the growth of the active layer is carried out in conditions which provide a strong equilibrium shift to the deposition reaction at a partial pressure of gallium chloride which is between $4 \times 10^{-3}$ and $5 \times 10^{-2}$ at least from the beginning of the transition phase.

In these conditions a partial zinc pressure is preferably used which is between $6 \times 10^{-4}$ and $3 \times 10^{-3}$, the partial pressure of the extra HCl is reduced to a final value lower than $2\times10^{-2}$ and the partial pressure of GaCl is between $4\times10^{-3}$ and $1\times10^{-2}$ at least from the beginning of the transition phase.

In addition, a mainly yellow electroluminescence is obtained in a favorable manner by choosing a partial zinc pressure between $1\times10^{-4}$ and $6\times10^{-4}$ of the overall pressure while reducing the partial pressure of the extra HCl at a rate lower than $1\times10^{-3}$ per second to a final value lower than $2\times10^{-2}$ and growing the active layer in conditions which provide a strong equilibrium shift to the reaction at a partial pressure of GaCl which is between $5\times10^{-3}$ and $1\times10^{-2}$ at least from the beginning of the transition phase.

Moreover, the yellow electroluminescence can be obtained in a favorable manner by facilitating the activity of the zinc in the active layer by a substantially instantaneous variation of the conditions to form the active layer. It is favorable to choose in the gaseous phase a partial zinc pressure between $4\times10^{-4}$ and $5\times10^{-3}$ and, while reducing the extra supply of HCl substantially instantaneously to maintain subsequently the partial pressure thereof at a value lower than $3\times10^{-2}$, the active layer is grown in conditions which provide a strong equilibrium shift to the deposition reaction at a partial pressure of GaCl which is between $4\times10^{-3}$ and $5\times10^{-2}$.

In these conditions a partial zinc pressure between $6\times10^{-4}$ and $3\times10^{-3}$ is preferably used, the partial pressure of the extra HCl is reduced to a value lower than $2\times10^{-2}$ and the partial pressure of GaCl is between $4\times10^{-3}$ and $1\times10^{-2}$.

FOURTH EXAMPLE

In an experiment described in the kind of examples 2 and 3 the following conditions have been established. The partial pressure of zinc is equal to $5\times10^{-4}$, that of GaCl is $4\times10^{-3}$ and the extra supply of HCl is reduced linearly in time from the initial value providing a partial pressure of $3.5\times10^{-2}$, which value is used during the growth of the n-type layer, to a value zero in the time interval of 1 minute, after which the growth of the active layer is continued for another 30 seconds without extra HCl. The devices obtained with this material provide a green electroluminescence at an operating voltage in the order of 7 Volts and an external quantum output in the order of $10^{-4}$.

A green luminescence is preferably obtained by choosing a partial zinc pressure between $1\times10^{-4}$ and $3\times10^{-3}$ of the overall pressure, while the supply s gradually varied, which results in a reduction of the partial pressure of the extra HCl at a rate lower than $1\times10^{-3}$ per second to a final value lower than $3\times10^{-2}$. The active layer is grown in conditions which provide an average equilibrium shift in the deposition reaction so that the activity of zinc in the said layer is slightly reduced by using a partial gallium chloride pressure, which, at least from the beginning of the transition phase is between $2.5\times10^{-3}$ and $6\times10^{-3}$.

In these conditions a partial zinc pressure is preferably used between $5\times10^{-4}$ and $3\times10^{-3}$.

In other conditions which are related to the experiment in the scope of a special apparatus, it may be favorable, however, to operate preferably at a partial zinc pressure between $1\times10^{-4}$ and $5\times10^{-4}$ in combination with the reduction of the partial pressure of the extra HCl to a final value lower than $2\times10^{-2}$.

The green electroluminescence can be obtained in addition by choosing growth conditions in which the activity of the zinc in the active layer is comparatively moderate but a substantially abrupt transition may be used between the n-type layer and the active layer. In order to obtain a substantially green electroluminescence in the gaseous phase, a partial zinc pressure is preferably chosen which is between $1\times10^{-4}$ and $2\times10^{-3}$ of the overall pressure while the supply of extra HCl is reduced substantially instantaneously so as to subsequently maintain the partial pressure thereof at a value lower than $3\times10^{-2}$ and the active layer is grown in conditions which provide an average equilibrium shift in the deposition reaction so that the activity of the zinc in the active layer is reduced by using a partial GaCl pressure between $2\times10^{-3}$ and $5\times10^{-3}$.

In these conditions a partial zinc pressure is preferably chosen between $4\times10^{-4}$ and $2\times10^{-3}$ and a partial GaCl pressure between $3\times10^{-3}$ and $5\times10^{-3}$.

It may be favorable, however, as the case may be, to use slightly different conditions in which the partial zinc pressure is chosen in a significantly lower range, namely between $1\times10^{-4}$ and $4\times10^{-4}$, while the partial GaCl pressure remains between $2.5.10^{-3}$ and $5.10^{-3}$ and the partial extra HCl pressure is reduced to a final value lower than $2\times10^{-2}$.

In all cases described above with reference to electroluminescence of green and yellow colors it is favorable in addition, due to the simplicity of the activities, to bring the partial pressure of HCl to a final value of zero.

The above-described method according to the invention is used in addition by means of detail adaptations to other impurities to form acceptors in gallium nitride, for example, cadmium or magnesium, in which said doping impurities may be used in elementary or combined form. The invention may be used in addition in other synthesis reactions of gallium nitride using one (or several) hydrogen halide(s) as an etchant for the gallium source and as an extra flux to restrict the equilibrium shift of the reactive gaseous phase.

The method according to the invention is used in the field of devices for displaying data by means of light.

What is claimed is:

1. An electroluminescent semiconductor device comprising a monocrystalline substrate, an n-type gallium nitride layer on said substrate, an active gallium nitride layer on said n-type layer and doped to at least full compensation of the natural donor impurities with acceptor impurities, surface electrode means for contacting said active layer, and means for contacting said n-type layer, at least a part of said n-type layer, which part extends parallel to said active layer and adjoins said active layer, being doped to less than full compensation by means of said acceptor impurities, the net concentration of donor impurities being smaller than the concentration of said natural impurities, and the net concentration of donor impurities being substantially homogeneous in said layer portion.

2. A device as claimed in claim 1, wherein in the said n-type layer portion of the device the value of said net concentration of the donor impurities is between one-tenth and one-millionth of the value of the concentration of said natural impurities.

3. A device as claimed in claim 1, wherein said n-type layer portion adjoining the active layer has a thickness exceeding 4 microns.

4. A device as claimed in claim 3, wherein said n-type layer portion adjoining the said active layer has a thickness of between about 10 and about 25 microns.

5. A device as claimed in claim 1, wherein the said active layer has a thicknss of between about 5 and about 200 nm.

6. A device as claimed in claim 5, wherein said active layer has a thickness of between about 50 and about 150 nm.

7. A device as claimed in claim 1, wherein between said substrate and said n-type layer portion which is partly compensated and and adjoins the said active layer, a further n-type layer portion is provided having a low resistivity and in which the donor impurities are substantially not compensated.

8. A device as claimed in claim 1, wherein said dopant comprises a metal selected from the group consisting of zinc, cadmium, beryllium, magnesium and lithium.

9. A device as claimed in claim 8, wherein said dopant is zinc.

10. A device as claimed in claim 1, wherein said substrate is transparent with respect to radiation emitted by said device.

11. A device as claimed in claim 10, wherein said substrate comprises corundum.

* * * * *

UNITED STATES PATENT AND TRADEMARK OFFICE
CERTIFICATE OF CORRECTION

PATENT NO. : 4,268,842
DATED : May 19, 1981
INVENTOR(S) : GUY M. JACOB et al

It is certified that error appears in the above—identified patent and that said Letters Patent is hereby corrected as shown below:

On the Title Page under Foreign Application Priority Data, item [30], insert -- Sept. 6, 1976 [Fr] France .... 7626777 -- .

-- Feb. 28, 1977 [Fr] France ... 7705770 --

Signed and Sealed this

Thirtieth Day of March 1982

[SEAL]

Attest:

Attesting Officer

GERALD J. MOSSINGHOFF

Commissioner of Patents and Trademarks